ELECTRICAL PULSE GENERATOR FOR UNIFORM OUTPUT SIGNAL AND HIGH DUTY CYCLE
Filed Oct. 13, 1958
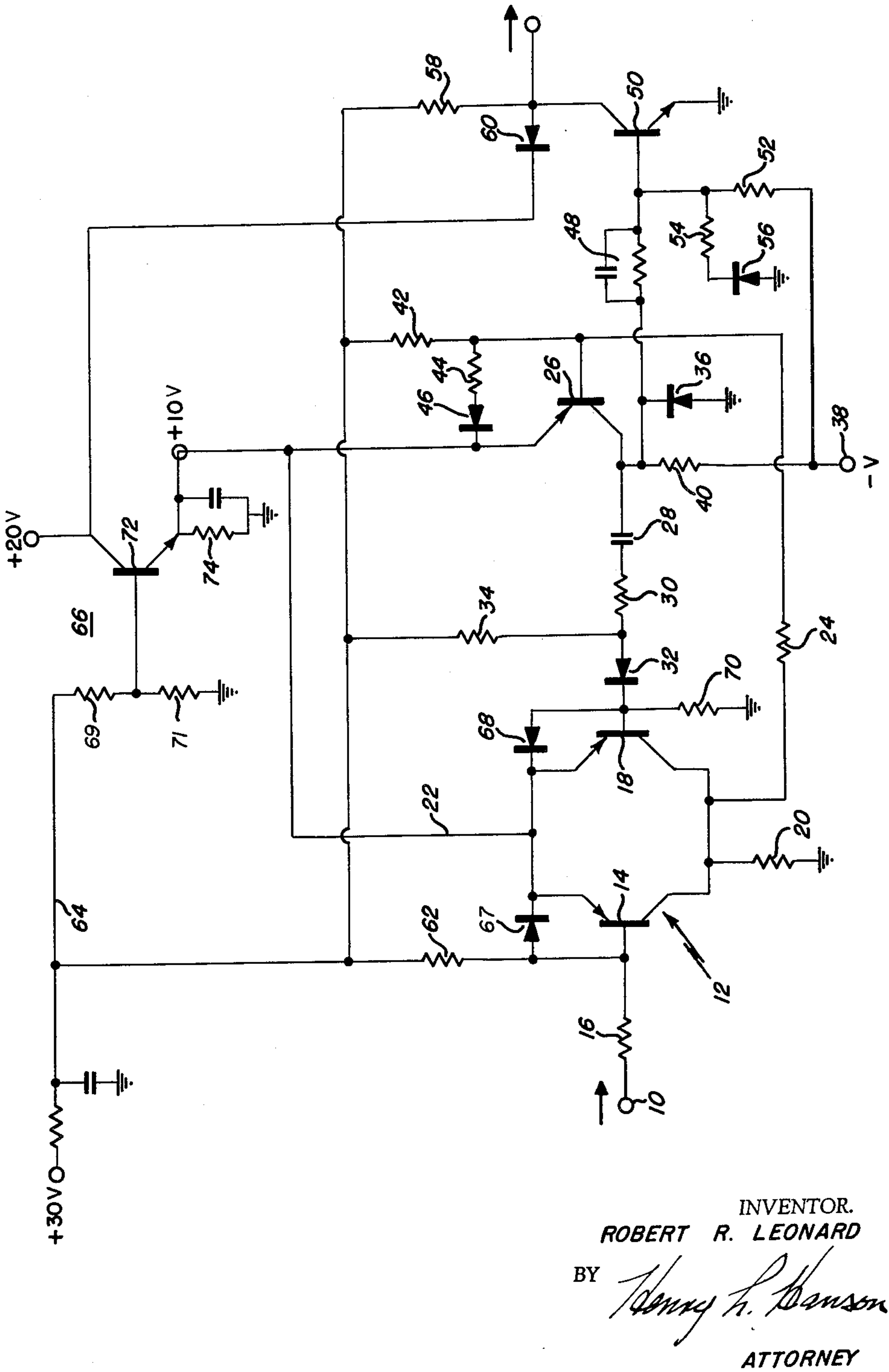
INVENTOR.
ROBERT R. LEONARD
BY Henry L. Hanson
ATTORNEY United States Patent Office 3,051,851

Patented Aug. 28, 1962

3,051,851

ELECTRICAL PULSE GENERATOR FOR UNIFORM OUTPUT SIGNAL AND HIGH DUTY CYCLE

Robert R. Leonard, Boston, Mass., assignor to Minneapolis-Honeywell Regulator Company, Minneapolis, Minn., a corporation of Delaware Filed Oct. 13, 1958, Ser. No. 766,908
8 Claims. (Cl. 307—88.5)

A general object of the present invention is to provide a new and improved electrical pulse generating circuit. More specifically, the present invention is concerned with a pulse generating circuit of the type, sometimes referred to as a univibrator, which is characterized by its ability to operate with uniform output signals even though there may be wide voltage changes in the power supply and its ability to operate with a very high duty cycle.

Univibrators, or one shot multivibrators, are used in electrical circuits for purposes of producing, in response to an input trigger pulse, an output pulse of uniform shaped dimension. Circuits of the present type heretofore available have been subject to output pulse variations which resulted from supply voltage variations. While this difficulty may be partially overcome by incorporating a complex voltage and current regulating circuitry in the combination, this is not satisfactory for the reason that such circuit additions are unduly complex and expensive as well as difficult to maintain particularly under a condition where a large number of such units may be used in a particular apparatus.

It is accordingly a more specific object of the present invention to provide a new and improved univibrator or pulse generating circuit wherein the voltages of the active and inactive elements of the circuit combination are all supplied from a common potential point such that the variations in voltage at the potential point will make no appreciable change in the operation of the circuit.

Another important requirement of univibrators in certain types of circuits is the ability of the circuit to operate with a relatively high duty cycle. In univibrators heretofore known, the timing of the univibrator is generally controlled by a suitable time delay circuit such as may be formed by a series connected resistor and condenser. The timing, insofar as a particular output pulse is concerned, will not be quite as critical as the time required between successive output pulses. The reason for this will be apparent when it is noted that the time delay circuit used to establish the timing of an output pulse must be quickly re-established in its quiescent state without affecting the output of the circuit in order to condition the circuit for the next operational pulse. The achievement of a high duty cycle in the operation of the present circuit is accomplished by a unique charging and discharging circuit for a time delay circuit, which circuit combination permits the circuit to operate with duty cycles with ninety percent or better.

As taught by the present invention, an R-C timing circuit is adapted to be switched into a charging circuit by way of a transistor which is normally not a part of the time delay circuit during the time that the critical timing of the operation takes place. This switching transistor is then adapted to be used to rapidly re-establish the initial quiescent charge in the time constant circuit so that a further output pulse may be produced. With this circuit configuration, the use of the transistor as a switch will prevent its internal impedance characteristics from affecting the critical time delay of the circuit so that the circuit operation will be dependent almost entirely upon the time constant of static elements in the circuit.

It is therefore a still further object of the present invention to provide a new and improved univibrator having a transistor switching device which functions to control the operational time of the circuit in a manner so that the impedance of the transistor device is not included in the circuit in a way to modify the timing of the circuit.

A still further object of the present invention is to provide a new and improved pulse generating circuit which utilizes a transistor for controlling the charging and discharging of a condenser wherein the voltages supplied for the charging circuit and for the transistor are derived from a single common potential point.

The foregoing objects and features of novelty which characterize the invention, as well as other objects of the invention, are pointed out with particularity in the claims annexed to and forming a part of the present specification. For a better understanding of the invention, its advantages and specific objects attained with its use, reference should be had to the accompanying drawing and descriptive matter in which there is illustrated and described a preferred embodiment of the invention.

Referring to the single FIGURE, the numeral 10 identifies the input terminal for the univibrator apparatus, said input terminal being adapted to receive from a suitable signal source, a negative pulse which may be referred to as as trigger pulse. The input terminal 10 is connected to a trigger stage 12 which includes a transistor device 14 having the usual base, emitter, and collector electrodes. The input terminal 10 is connected to the base electrode of the transistor 14 by way of a coupling resistor 16.

Coupled effectively in parallel with the transistor 14 is a further transistor 18 having the usual base, emitter, and collector electrodes. The emitter and collector electrodes of the transistor 18 are directly connected with the corresponding electrodes of the transistor 14. Further, the collectors of the two transistors 14 and 18 are connected by way of a common impedance, in the form of a resistor 20, to ground. Power for the transistors 14 and 18 is supplied by way of a power lead 22, which will be discussed more fully below.

The resistor 20 functions as a load impedance and any signal thereon is coupled by way of a coupling resistor 24 to a further transistor 26 at the base electrode thereof. Transistor 26, in addition to a base electrode, includes emitter and collector electrodes. The collector electrode of the transistor 26 is coupled, by way of a feedback circuit, to the base electrode of the transistor 18. Included in this feedback circuit is the condenser 28, a current limiting resistor 30, and a diode 32. The condenser 28 is the condenser used as the reactive impedance in the time delay circuit of the combination and is adapted to operate in conjunction with a resistor 34 to determine the timing of the pulses which are generated by the circuit. A clamping diode 36 is connected to the collector electrode of the transistor 26 and to a ground terminal. Operating with this clamping diode 36 is a negative power supply having a terminal 38 which is connected to the collector of the transistor 26 by way of a resistor 40. Input biasing signals for the base electrode of the transistor 26 are supplied by way of the resistors 42 and 44, as well as by way of a diode 46.

The output of the circuit is taken from the collector electrode of the transistor by way of an R-C coupling network 48, the latter being connected to the base electrode of a further transistor 50. A negative bias for the base electrode of the transistor 50 is supplied by way of the negative power supply terminal 38, a resistor 52, with the potential on the output of the resistor 52 being determined by a clamp circuit including a further resistor 54, and a diode 56. The transistor 50 has power supplied to the collector-emitter circuit by way of a resistor 58 while the output of the transistor 50 is taken from the collector thereof. The output will be clamped to a predetermined positive voltage by way of a clamping diode 60.

Biasing voltages for the transistor 14 are supplied by way of a biasing resistor 62 which leads to a power supply lead 64. For example, the voltage on the supply lead 64 may be assumed to be approximately 30 volts. Backbiasing for the transistor 14 is supplied by way of a diode 67. Further, a diode 68 serves as a backbiasing diode for the transistor 18 as well as a circuit element used in the discharging circuit for the condenser 28 as will be explained hereinafter.

The voltage on the lead 64 is assumed to be higher than the voltage which it is assumed is within the normal operating ranges on the transistors 14, 18, and 26. It has been found that excessively high voltages may adversely affect the transistors and actually destroy them. For this reason, it is desirable that the voltage available on the emitter-collector circuits of the respective transistors be dropped down to a level which is within the normal operating range of the transistors. This is achieved in the present invention by way of the proportional divider circuit 66. The proportional divider circuit 66 comprises a pair of resistors 69 and 71 which are connected in series across the supply voltage terminals of the high voltage power supply. Connected to the junction of the resistors 69 and 71 is the base electrode of a transistor 72, the latter being connected in an emitter-follower configuration. The collector electrode of transistor 72 leads to a further positive potential source which may be, for example, twenty volts. The emitter of the transistor 72 is connected to an R-C output network 74. By appropriate selection of the resistors 69 and 71, the voltage on the high voltage lead 64 may be dropped down to approximately ten volts. This 10-volt signal applied to the base electrode of the transistor 72 will cause the output of the transistor, at the emitter thereof, to likewise have a +10 volt signal. Using this scheme, a negligible amount of current need flow through the resistors 69 and 71 in establishing the desired voltage on the base electrode of the transistor 72. However, due to the controlling action of the transistor 72, a voltage proportional to that input voltage will be maintained on the output emitter electrode even though a substantial amount of current may be flowing through the transistor 72. It will be apparent that the voltage on the output of the emitter follower circuit, i.e. on the emitter electrode of the transistor 72, will be dependent upon voltage variations in the high voltage power supply as represented on the lead 64. Thus, proportional variations of the high voltage will be produced on the output of the transistor 72. This will be so even though there may be variations in the voltage supplied to the transistor 72 by way of the 20 volt power supply lead.

Considering the operation of the present circuit, the circuit is considered first in its quiescent state which is, in effect, the state before or after a pulse has been generated and the circuit elements have come back to their normal static condition. When in the quiescent state, the transistors 14 and 18 are both biased to be nonconducting in their emitter-collector circuits. The biasing for the transistor 14 will be applied to the base electrode of the transistor by way of a connection from lead 64 and resistor 62. Because of this connection, the base electrode will be biased more positive than the emitter electrode of the transistor so that the transistor will be cut off. Consequently, there will be substantially no current flowing through the transistor 14. The transistor 18 will be cut off for the reason that this transistor likewise has its base electrode biased positive in respect to the emitter electrode. The biasing circuit for the base electrode of this transistor may be traced from the positive power supply lead 64 through the resistor 34, diode 32, and resistor 70 to ground. The magnitudes of the resistors 34 and 70 are so selected that the upper terminal of resistor 70 in the drawing is at a potential which is more positive than the positive potential appearing on the lead 22 connected to the output terminal of the proportional voltage divider circuit 66.

The transistor 26 is biased to be fully conducting. In this case, the biasing potential on the base electrode of the transistor 26 will be less than the voltage on the emitter electrode. The biasing circuit for the base electrode of the transistor 26 may be traced from the positive power supply terminal 64 through resistor 42, resistor 24, and resistor 20 to ground. In this instance, the voltage divider is so selected that the potential at the lower end of resistor 42, which is the potential of the base electrode at the transistor 26, will be less than the potential on the emitter. It will be noted that the emitter electrode is connected directly to the output terminal of the proportional divider stage 66. The output stage which includes a transistor 50 is biased to be conductive by the connection to the collector of transistor 26 by way of the network 48, the latter being at approximately +10 volts. Since the transistor 50 is conducting, the collector electrode, which is the output terminal of the circuit, will effectively be connected to ground.

The circuit will remain in the quiescent state until such time as a trigger pulse is received at the input terminal 10. When a trigger pulse is received at the input terminal, it will be a negatively going input pulse which will be effective to bias the base electrode of the transistor 14 into the region wherein the transistor will be switched into the fully conducting state. When so switched, the collector electrode of the transistor 14 will assume the potential of the emitter electrode which will be approximately +10 volts. This ten-volt signal will be coupled by way of the resistor 24 to the base electrode of the transistor 26. The effect of the signal will be to cut the transistor off so far as current flow in the emitter-collector circuit is concerned. Thus, current is able to flow from the negative voltage terminal 38 through the resistor 40 and the clamping diode 36 to effectively ground the collector electrode of the transistor 26 as well as the right hand side of the condenser 28. Grounding of the right side of the condenser 28 is reflected through the resistor 30 to the anode of the diode 32 so that this diode will be cut off. Thus, the potential on the base electrode of the transistor 18 will begin to drop from its previous value of approximately 10 volts to a value where the transistor 18 will be switched to be fully conducting in the emitter-collector circuit. This latter circuit will function as a holding circuit for the univibrator so that even though the trigger stage should be cut off due to the disappearance of the input pulse, the circuit will be held in its presently described state with the transistor 18 conducting until the circuit calls for a change.

With the right end of the condenser 28 effectively grounded by way of the diode 36, current will begin to flow from the plus voltage line 64 by way of the resistor 34 and resistor 30 through the condenser 28 and diode 36 to ground. The effect of this will be to start the charging of the condenser 28. As soon as the voltage on the condenser has charged to a point where the anode side of the diode 32 is approximately +10 volts, the diode will once again become conductive to thereby apply a biasing voltage to the transistor 18 to cut this transistor off. As soon as the transistor 18 has been switched to the off state, this will result in a signal being coupled by way of the resistor 24 to the base electrode of the transistor 26 to switch this transistor back to the conducting state. As soon as the transistor 26 is switched into the conducting state, the potential on the collector electrode thereof will once again return to +10 volts because of the fact that the emitter-collector circuit will be acting substantially as a short circuit.

It will be seen from the description that has been made that the potential on the collector electrode of the transistor 26 is switched from the potential of +10 to ground potential and then back to a potential of +10. This pulse produced by the pulse generating circuitry is then applied to the output transistor 50 where the pulse will be effective to render this transistor nonconducting so that the collector electrode thereof will tend to rise to the +20 volt potential to which it is clamped by way of the clamping diode 60. The transistor 50 will be biased nonconductive by the connection to the junction of resistors 52 and 54, the potential of which will be negative because of the connection to the terminal 38. As soon as the pulse of the pulse generator circuitry has ceased, the transistor 50 is once again switched to the conducting state so that the output, or collector electrode, will be substantially at ground potential.

It should be observed in the aforedescribed circuit that the charging circuit for the condenser 28 is from the +30 volt supply lead 64. Thus, there is a tendency for the condenser 28 to charge to a potential of +30 volts. By so selecting the voltage sources of the circuit, the circuit may be made to function on the straight line characteristic of the R-C circuit formed by the resistor 34 and condenser 28. Since it is apparent that the circuit need charge only to the +10 volt potential, this means that only a small portion of the total charging characteristic is utilized in determining the time of the pulse produced by the circuit.

It should further be noted that since the critical operating voltage for the transistor 18 is directly related to the +30-volt power supply voltage, the fact that the +10 volts used in the control of the base electrode of the transistor 18 is derived from the proportional dividing network 66, variations of the basic supply voltage on the lead 64 will be proportionately effective in the time constant circuit and on transistor 18 as well as in the other operating circuits of the pulse generator.

After the circuit has returned to the quiescent state, it is desired that the circuit be quickly reconditioned for the next operating trigger pulse. This means that the charge on the condenser 28 must be quickly restored to its quiescent state. The discharging circuit may be traced from the left end of condenser 28 through resistor 30, diodes 32 and 68, lead 22, and the emitter-collector circuit of transistor 26, back to the right hand terminal of the condenser 28. Thus, any charge in the condenser 28 will be removed and the circuit will be conditioned to accept the next trigger pulse. The resistor 30 in this discharging circuit is included primarily for purposes of limiting the current flow through the transistor 26 to a safe value.

As soon as the condenser 28 has had the charge thereon removed to the level of the quiescent state, the circuit will be conditioned to accept a further trigger pulse and thereby produced a further pulse.

In considering the aforedescribed charging circuit for the condenser 28, it will be noted that the charging circuit does not include the transistor 26 even though the transistor 26 is effective to control the charging circuit. Consequently, the charging circuit time constant will be affected only by the resistance of the resistor 34 and the resistance of the resistor 30 to thereby insure that the changing or replacing of the transistor 26 in the circuit will not affect the timing of the circuit. Inasmuch as the transistor 26 functions primarily to re-establish the original charge on the condenser 28 at the end of the pulse, the impedance of the transistor 26, when in the conducting state, will have an effect only on the time that it takes to re-establish this charge on the condenser. This effect relates only to the duty cycle of the circuit and will not affect the output wave form of the pulse generated by the circuit.

While, in accordance with the provisions of the statutes, there has been illustrated and described the best forms of the invention known, it will be apparent to those skilled in the art that changes may be made in the apparatus described without departing from the spirit of the invention as set forth in the appended claims and that in some cases, certain features of the invention may be used to advantage without a corresponding use of other features.

What is claimed as new is:

1. An electrical pulse generator comprising a first transistor having base, emitter, and collector electrodes, a second transistor having base, emitter, and collector electrodes, a single reference voltage source, means connecting said first transistor to said voltage source to be cut off in the emitter-collector circuit, means connecting said second transistor to said voltage source to be conductive in said emitter-collector circuit, a condenser connected between said first and second transistors, means including said first transistor connected to switch and hold said second transistor to be nonconductive in its emitter-collector circuit, a charging circuit for said condenser which is independent of the emitter-collector electrode circuit of said first transistor and is connected directly to said voltage source, said charging circuit being activated by switching said second transistor to be nonconductive in said emitter-collector circuit, and a discharge circuit connected to said condenser, said discharge circuit comprising said second transistor when switched to be conductive.

2. An electrical pulse generator comprising a first transistor having base, emitter, and collector electrodes, a second transistor having base, emitter, and collector electrodes, a single reference voltage source, means connecting said first transistor to said voltage source to be cut off in the emitter-collector circuit, means connecting said second transistor to said voltage source to be conductive in said emitter-collector circuit, a condenser connected between said first and second transistors, a charging circuit for said condenser connected to said voltage source, said charging circuit being independent of said fast transistor and activated by switching said second transistor to be nonconductive in said emitter-collector circuit, triggering means including said first transistor connected to switch said second transistor to be nonconductive in its emitter-collector circuit, a diode shunting a pair of electrodes of said first transistor, and a discharge circuit connected to said condenser, said discharge circuit comprising said second transistor when switched to be conductive and said diode.

3. In an electrical pulse generator, the combination comprising a resistor and condenser connected to form a resistor-condenser circuit, a power supply having a first potential thereon, means independent of any variable switching means connecting said resistor and said condenser in series with said power supply, a transistor having base, emitter, and collector electrodes, means connecting said transistor to said resistor condenser circuit to control the charging and discharging thereof, a proportional voltage divider connected to said power supply, said proportional voltage divider comprising a second transistor having base, emitter, and collector electrodes, a pair of resistors connected in series across said power supply, means connecting the base of said second transistor to the junction of said pair of resistors, and means connecting the emitter-collector circuit of said first transistor to a point on the emitter-collector circuit of said second transistor.

4. In an electrical pulse generator, the combination comprising a resistor condenser circuit, a power supply having a first potential thereon, means independent of any variable switching means connecting said power supply directly to said resistor-condenser circuit, a transistor having base, emitter, and collector electrodes, means connecting said transistor to said resistor-condenser circuit to control the charging and discharging thereof, a proportional voltage divider connected to said power supply, said proportional voltage divider comprising a second transistor having base, emitter, and collector electrodes connected as an emitter-follower, a pair of resistors connected in series across said power supply, means connecting the base of said second transistor to the junction of said pair of resistors, and means connecting the emitter-collector circuit of said first transistor to the output of said emitter-follower.

5. In an electrical pulse generator, the combination comprising a resistor and condenser connected to form a resistor-condenser circuit, a power supply having a first potential thereon, means independent of any variable switching means connecting said resistor and condenser in series with said power supply, a transistor having base, emitter, and collector electrodes, means connecting said transistor to said resistor-condenser circuit to control the charging and discharging of said condenser, a proportional voltage divider connected to said power supply, said proportional voltage divider comprising a second transistor having base, emitter, and collector electrodes, a pair of resistors connected in series across said power supply, means connecting the base of said second transistor to the junction of said pair of resistors, and means connecting the emitter-collector circuit of said first transistor to the emitter-electrode of said second transistor.

6. A univibrator comprising a first pair of transistors each having base, emitter, and collector electrodes, means connecting said emitter and collector electrodes of said pair in parallel, a common load impedance connected to said collector electrodes, means connected to said pair of transistors to bias both of said transistors to be nonconductive, a single input signal terminal connected to one of said pair of transistors at the base electrode thereof, a feedback connection connected to the other of said pair of transistors at the base electrode thereof, a further transistor having base, emitter, and collector electrodes, means connecting the base electrode of said further transistor to said load impedance, a condenser connected between the emitter-collector electrode circuit of said further transistor and said feedback connection, a resistor connected to said condenser and to a power supply terminal, and an output terminal connected to said further transistor.

7. A univibrator comprising a first pair of transistors each having base, emitter, and collector electrodes, means connecting said emitter and collector electrodes of said pair in parallel, a common load impedance connected to said collector electrodes, means connected to said pair of transistors to bias both of said transistors to be nonconductive, a single input signal terminal connected to one of said pair of transistors at the base electrode thereof, a feedback connection connected to the other of said pair of transistors at the base electrode thereof, a further transistor having base, emitter, and collector electrodes, means connecting the base electrode of said further transistor to said load impedance, a condenser connected between the emitter collector electrode circuit of said further transistor and said feedback connection, a pair of power supply terminals, a resistor connected to said condenser and to one of said power supply terminals, a diode connecting one side of said condenser to the other of said power supply terminals, and an output terminal connected to said further transistor.

8. A univibrator comprising a first pair of transistors each having base, emitter, and collector electrodes, means connecting said emitter and collector electrodes of said pair in parallel, a common load impedance connected to said collector electrodes, means connected to said pair of transistors to bias both of said transistors to be nonconductive, a single input signal terminal connected to one of said pair of transistors at the base electrode thereof, a feedback connection connected to the other of said pair of transistors at the base electrode thereof, a further transistor having base, emitter, and collector electrodes, means connecting the base electrode of said further transistor to said load impedance, a condenser connected between the emitter-collector electrode circuit of said further transistor and said feedback connection, a resistor connected to one side of said condenser and to a power supply terminal, a first diode connecting the other side of said condenser to a further power supply terminal, a second diode connecting said condenser in a series circuit with the emitter-collector circuit of said further transistor, and an output terminal connected to said further transistor.

References Cited in the file of this patent

UNITED STATES PATENTS

| | | |
|---|---|---|
| 2,708,720 | Anderson | May 17, 1955 |
| 2,735,001 | Dickinson | Feb. 14, 1956 |
| 2,751,550 | Chase | June 19, 1956 |
| 2,797,327 | Kidd | June 25, 1957 |
| 2,827,568 | Altschul | Mar. 18, 1958 |
| 2,827,574 | Schneider | Mar. 18, 1958 |
| 2,874,315 | Reichert | Feb. 17, 1959 |
| 2,903,603 | Glenn | Sept. 8, 1959 |
| 2,920,216 | Brauer | Jan. 5, 1960 |